US011721599B2

(12) United States Patent
Yuan et al.

(10) Patent No.: US 11,721,599 B2
(45) Date of Patent: Aug. 8, 2023

(54) SEMICONDUCTOR TESTKEY PATTERN AND TEST METHOD THEREOF

(71) Applicant: United Semiconductor (Xiamen) Co., Ltd., Fujian (CN)

(72) Inventors: Linshan Yuan, Fujian (CN); Guang Yang, Fujian (CN); Jinjian Ouyang, Fujian (CN); Jiawei Lyu, Fujian (CN); Chin-Chun Huang, Hsinchu County (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 280 days.

(21) Appl. No.: 17/216,697

(22) Filed: Mar. 30, 2021

(65) Prior Publication Data

US 2022/0285235 A1 Sep. 8, 2022

(30) Foreign Application Priority Data

Mar. 3, 2021 (CN) .......................... 202110234796.7

(51) Int. Cl.
*G01R 27/08* (2006.01)
*H01L 21/66* (2006.01)
*G01R 27/02* (2006.01)
*G01R 27/14* (2006.01)
*G01R 17/10* (2006.01)
*H01L 27/06* (2006.01)
*G01R 31/28* (2006.01)
*G01R 27/26* (2006.01)

(52) U.S. Cl.
CPC ............ *H01L 22/34* (2013.01); *G01R 17/105* (2013.01); *G01R 27/02* (2013.01); *G01R 27/14* (2013.01); *G01R 27/2635* (2013.01); *G01R 31/2831* (2013.01); *G01R 31/2858* (2013.01); *H01L 27/0611* (2013.01)

(58) Field of Classification Search
CPC ... H01L 22/34; H01L 27/0611; H01L 21/268; H01L 22/14; H01L 22/30; G01R 27/02; G01R 17/105; G01R 27/14; G01R 31/2831; G01R 31/2858; G01R 27/2635
USPC .......... 324/76.11–76.83, 459, 600, 649, 691, 324/702, 703
See application file for complete search history.

(56) References Cited

U.S. PATENT DOCUMENTS

| | | | |
|---|---|---|---|
| 2006/0001144 A1 | 1/2006 | Uehling | |
| 2008/0197351 A1* | 8/2008 | Ting | H01L 22/34 257/E23.001 |
| 2008/0265247 A1* | 10/2008 | Feustel | H01L 22/34 257/E23.002 |
| 2010/0117080 A1 | 5/2010 | Chen | |
| 2012/0168752 A1* | 7/2012 | Wu | H01L 22/34 257/E23.179 |
| 2013/0048979 A1 | 2/2013 | Piper | |
| 2014/0077209 A1* | 3/2014 | Kojima | H01L 22/34 257/48 |

(Continued)

FOREIGN PATENT DOCUMENTS

CN 104835803 A 8/2015

*Primary Examiner* — Raul J Rios Russo
(74) *Attorney, Agent, or Firm* — Winston Hsu

(57) ABSTRACT

The invention provides a semiconductor testkey pattern, the semiconductor testkey pattern includes a high density device region and a plurality of resistor pairs surrounding the high density device region, wherein each resistor pair includes two mutually symmetrical resistor patterns.

11 Claims, 4 Drawing Sheets

(56) References Cited

U.S. PATENT DOCUMENTS

2017/0200661 A1* 7/2017 Lee .................. H01L 24/03
2018/0156862 A1* 6/2018 Chen ................ G01R 31/2884

* cited by examiner

SEMICONDUCTOR TESTKEY PATTERN AND TEST METHOD THEREOF

BACKGROUND OF THE INVENTION

1. Field of the Invention

The present invention relates to the field of semiconductor manufacturing processes, in particular to a semiconductor testkey pattern including a plurality of resistor pair.

2. Description of the Prior Art

In the field of semiconductor manufacturing, resistor are common electronic components. In some practical applications, resistors are made in pairs to be used in electronic products that are also paired, such as headphones.

However, even if the paired resistors have the same or symmetrical patterns, some of the steps in the semiconductor manufacturing process may affect the resistance values of the resistors, resulting in unequal resistance values on both sides of the paired resistors, and affecting the quality of subsequent electronic products (for example, causing inconsistent sounds on the left and right sides of headphones).

SUMMARY OF THE INVENTION

Therefore, it is necessary to provide an improved method to solve the above problems.

The invention provides a semiconductor testkey pattern, which comprises a high density device region and a plurality of resistor pairs surrounding the high density device region, wherein each resistor pair comprises two mutually symmetrical resistor patterns.

The invention also provides a testing method of semiconductor testkey pattern, which comprises providing a semiconductor testkey pattern including a high density device region and a plurality of resistor pairs surrounding the high density device region, wherein each resistor pair includes two mutually symmetrical resistor patterns, performing a laser heating step on the semiconductor testkey pattern, and testing the resistance change of the semiconductor testkey pattern.

The invention provides a semiconductor testkey pattern, which is characterized in that the applicant finds that the laser heating step will have a great influence on the resistance value of the resistance device, so in order to find out the problem in time at the front end of the process, the applicant provides a testkey pattern, which surrounds a plurality of resistor pairs around the high-density device region. Then, using this testkey pattern, the laser heating step can be performed from different angles, and the influence of hot spot diffusion test on the resistance value of the resistor pair can be performed. The semiconductor testkey pattern provided by the invention can be applied to the test of laser heating steps in different directions, and the most suitable process parameters can be found out through the test steps. Therefore, the problem of unpaired resistors can be found at the front end of the process, and the problems can be corrected in time to improve the yield and efficiency of the process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

One object of the present invention is to design a semiconductor testkey pattern for observing the influence of the laser heating step on the resistor pair.

Figure 1:
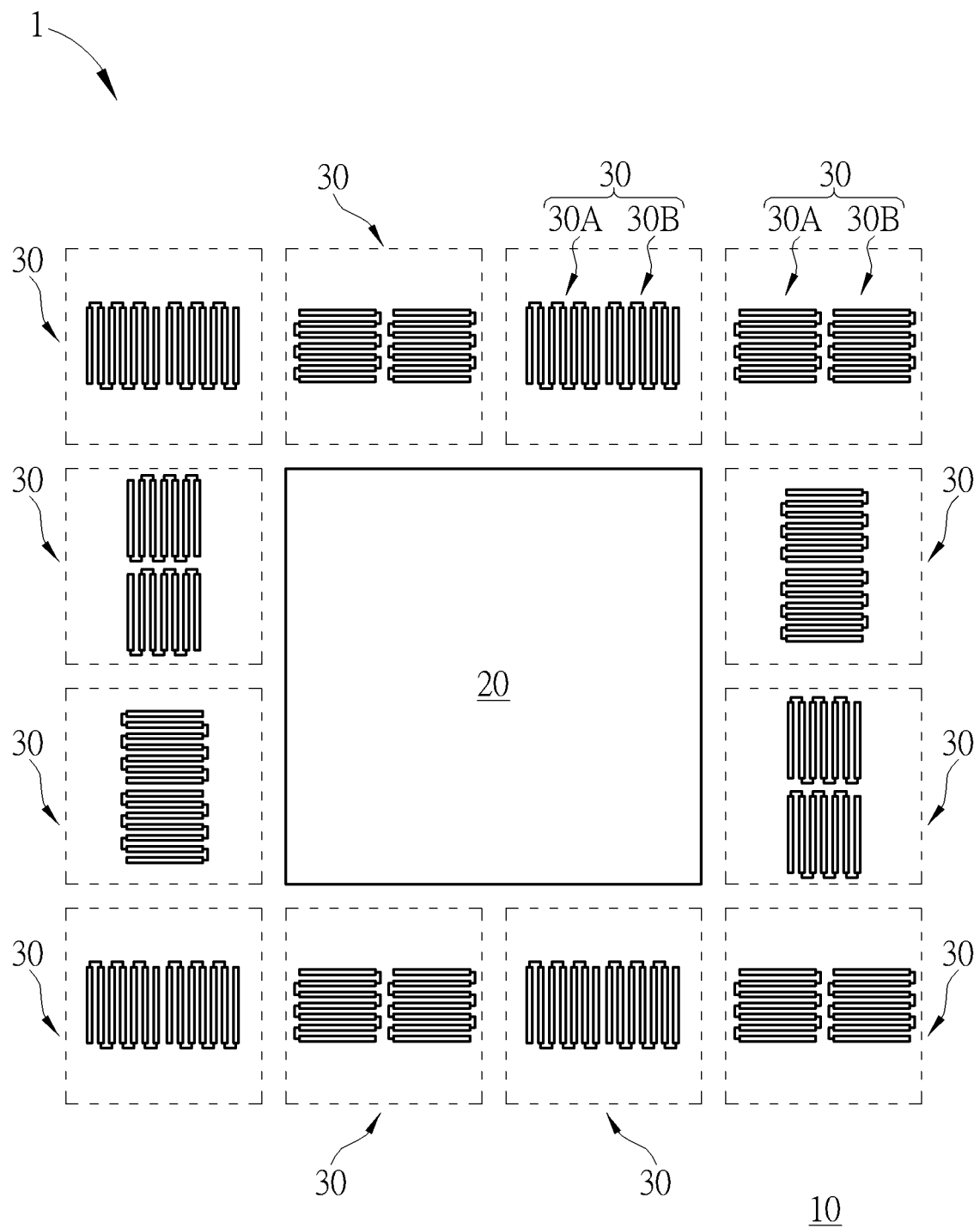
FIG. 1 shows a top view of a semiconductor testkey pattern according to an embodiment of the present invention.

In order to achieve the above objectives, please refer to FIG. 1, which shows a top view of a semiconductor testkey pattern provided according to an embodiment of the present invention. First, a high density device region 20 is formed on a substrate 10, and then a plurality of resistor pairs 30 are surrounded around the high density device region 20, wherein each resistor pair 30 is composed of two paired resistor patterns 30A and 30B. That is, every two pairs of resistor patterns 30A, 30B together constitute a resistor pair 30. The above-mentioned elements on the substrate 10 constitute a semiconductor testkey pattern 1.

Figure 2:
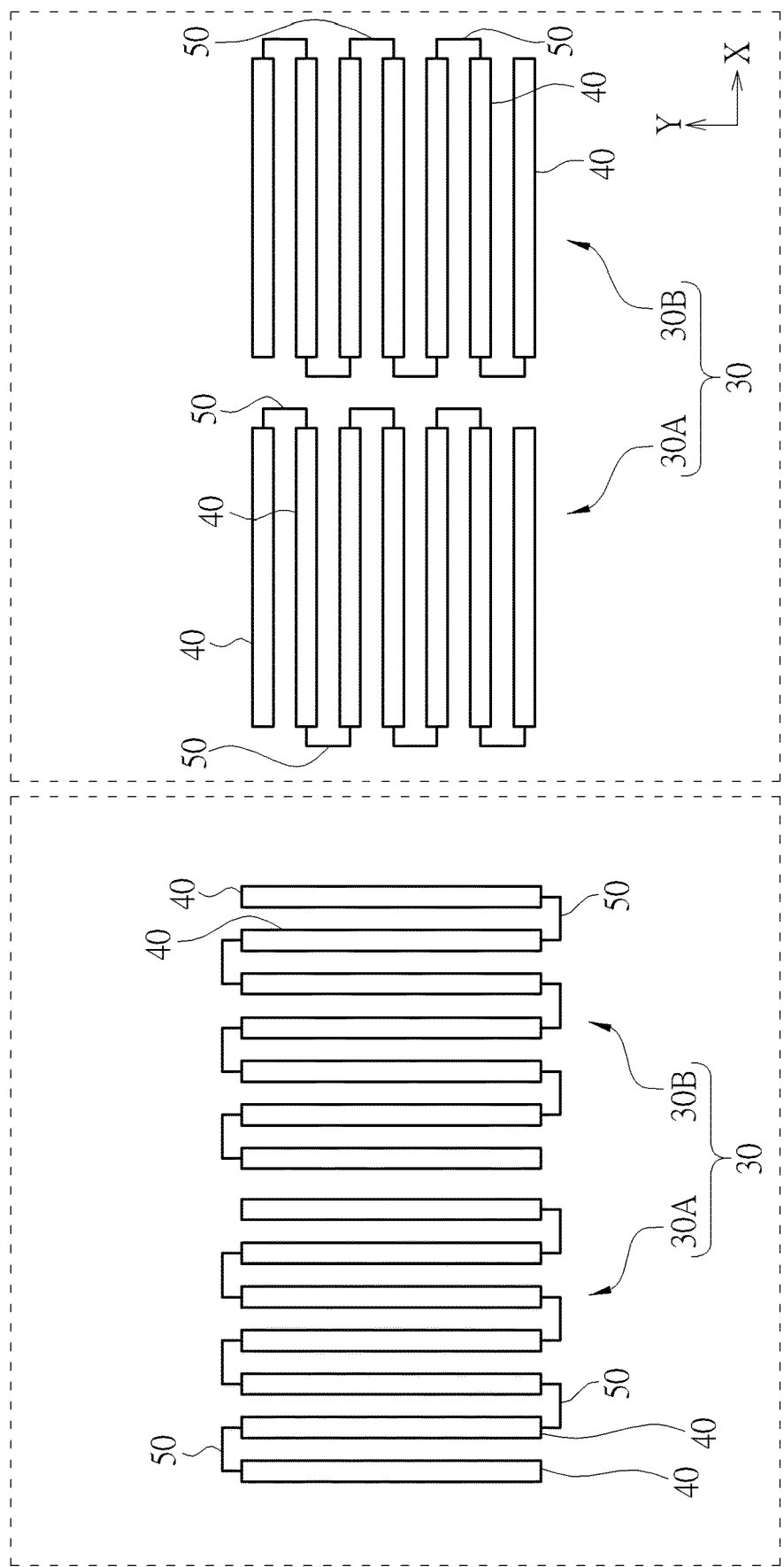
FIG. 2 shows an enlarged schematic diagram of a part of resistor pairs.

FIG. 2 shows an enlarged schematic diagram of a part of resistor pairs. As shown in FIG. 2, the resistor pattern 30A or 30B in each resistor pair 30 includes a plurality of strip-shaped resistor patterns 40 arranged in parallel with each other, and a plurality of wires 50 connect the strip-shaped resistor patterns 40 in series. According to the arrangement direction of the strip-shaped resistor patterns 40, the resistor pairs 30 may include resistor pairs 30 arranged longitudinally (or along the Y direction, such as the resistor pair 30 on the left side of FIG. 2) and resistor pairs 30 arranged horizontally (or along the X direction, such as the resistor pair 30 on the right side of FIG. 2). It is worth noting that the invention does not limit that resistor pairs can only be arranged in the horizontal or longitudinal direction, and may also be arranged in other directions, which also belongs to the scope of the invention. In addition, preferably, the two resistor patterns 30A and 30B included in any resistor pair 30 are arranged in the same direction, for example, both are arranged in the longitudinal direction or both are arranged in the horizontal direction.

Referring to FIG. 1 again, in this embodiment, a plurality of resistor pairs 30 are arranged around the high density device region 20. Preferably, adjacent resistor pairs 30 have different arrangement directions, for example, one longitudinally arranged resistor pair 30 is located between two horizontally arranged resistor pairs 30, and likewise, one horizontally arranged resistor pair 30 is located between two longitudinally arranged resistor pairs 30. Moreover, in this embodiment, the shortest distance between the high density device region 20 and any resistor pair 30 is preferably between 1.5 µm and 50 µm.

The high density device region 20 includes, for example, polysilicon patterns or doped regions, wherein the density of the devices is preferably higher than 60%, and the size of the high density device region 20 is preferably between 100 and 10,000 square but the present invention is not limited thereto. Generally speaking, the high density device region 20 is, for example, a circuit pattern region arranged beside a resistor pair in an electronic product, which may contain circuit patterns such as transistor switches and driving devices. These elements belong to the conventional technology in the field, and will not be described in detail here.

Figure 3:
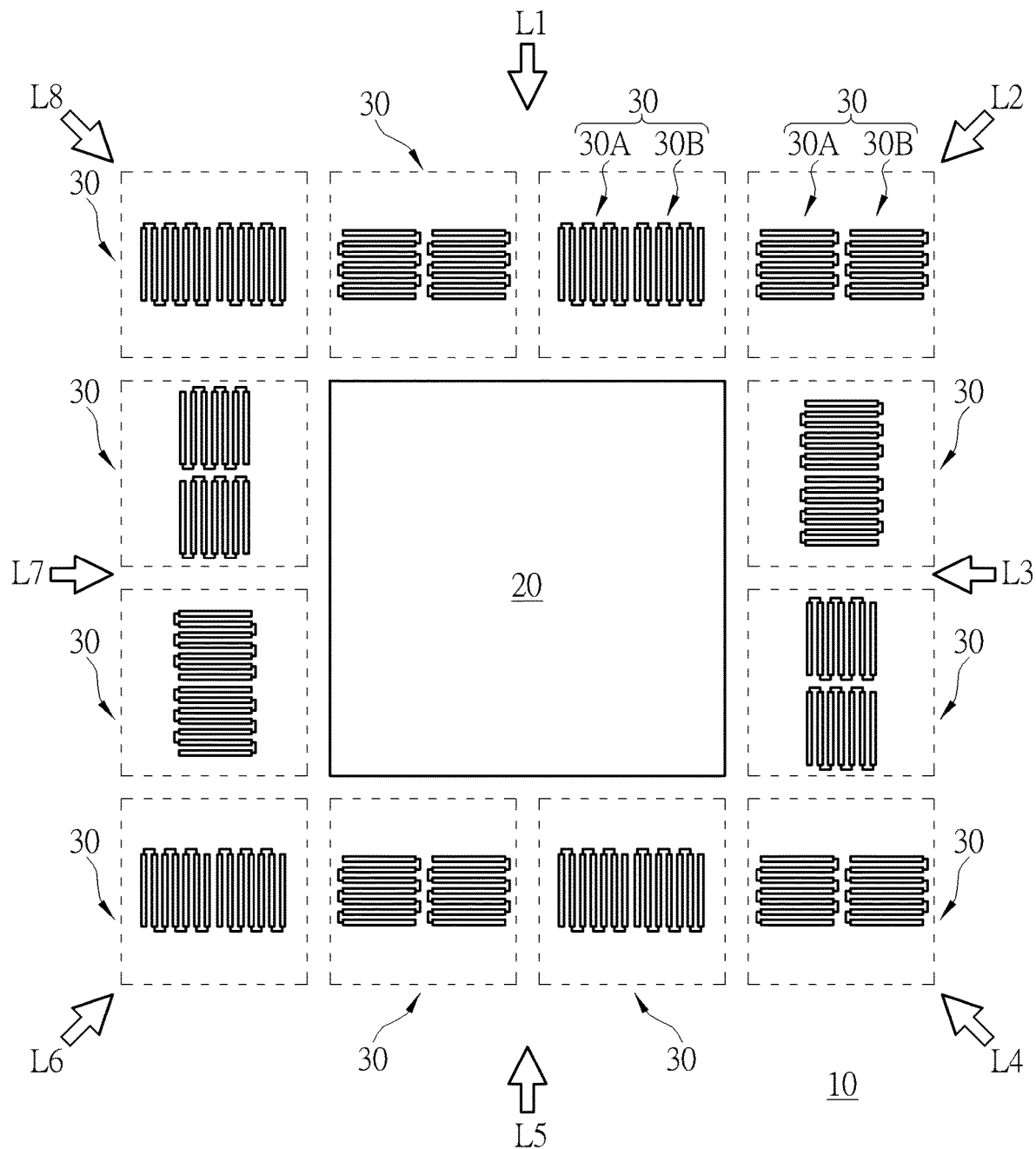
FIG. 3 is a schematic diagram showing a top view of the semiconductor testkey pattern shown in FIG. 1 subjected to a laser heating step test from different directions.
Figure 4:
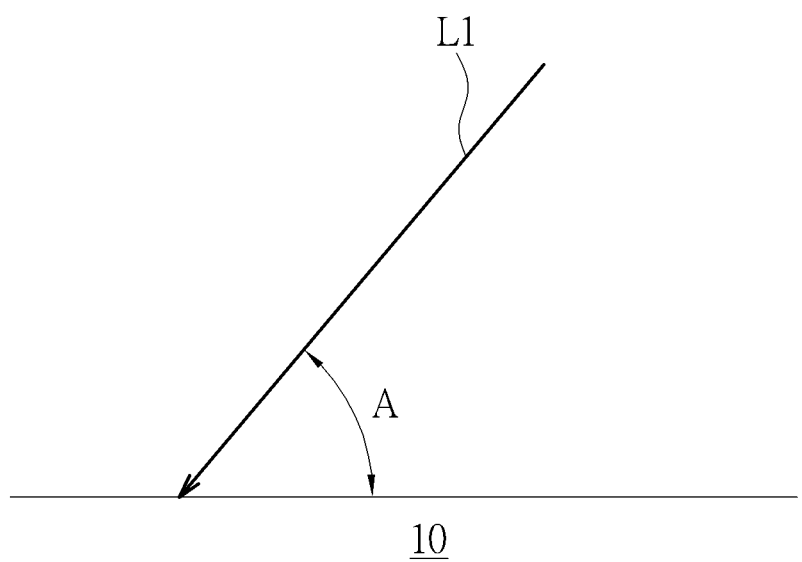
FIG. 4 is a schematic cross-sectional view of one of a laser.

The applicant found that in the semiconductor manufacturing process, there are many factors that affect the resistance values of resistor pairs, such as the laser heating step (including laser direction, temperature, hot spot diffusion), the area density of adjacent resistor pairs (such as shallow trench isolation or active area), and the arrangement direction of resistor pairs themselves (horizontal or vertical), etc. These reasons may affect the resistance values of resistor pairs and cause the resistance values on both sides of resistor pairs to be different (or can also be called mismatch). According to the experimental results of the applicant, it is found that the direction of the laser heating step and the arrangement direction of the resistor pair have great influence on the resistance value of the resistor pair. Specifically, the laser will have an impact on the resistance of the resistor pair, and the higher the temperature heated by the laser, the lower the resistance of the resistor. In addition, the direction of the laser and the arrangement direction of the resistor pair will also affect the resistance value of the resistor pair. For example, if the irradiation direction of the laser and the arrangement direction of the resistor pair are perpendicular to each other, the resistor pair will easily absorb more heat energy, resulting in a more obvious decrease in resistance value. Therefore, the semiconductor testkey pattern provided in FIG. 1 of the present invention can be used to test the influence of the laser heating step and the direction of the resistor pair on the resistance value of the resistor pair. The test method is described in the following paragraphs:

FIG. 3 shows a top view of the laser heating step test of the semiconductor testkey pattern shown in FIG. 1 from different directions, and FIG. 4 shows a cross-sectional view of one of the lasers. As shown in FIG. 3, the semiconductor testkey pattern 1 shown in FIG. 1 can be heated by laser from different directions. In FIG. 3, lasers in different directions are denoted by different reference numbers, such as laser L1, laser L2, laser L3, laser L4, laser L5, laser L6, laser L7 and laser L8. It is worth noting that each laser L1-L8 represents one of the laser heating test steps, and the laser heating steps in different directions are carried out on different substrates. In other words, a plurality of substrates can be prepared in advance, and the same semiconductor testkey patterns 1 are formed on each substrate, and then the laser heating steps in different directions are performed on the semiconductor testkey patterns 1 on different substrates.

Referring to FIG. 4, in this embodiment, the direction of the laser toward the semiconductor testkey pattern 1 is adjusted (for example, lasers L1-L8, taking L1 as an example in FIG. 4), and the included angle between the laser and the substrate horizontal plane is fixed (for example, in FIG. 4, the included angle A between the laser and the substrate horizontal plane is fixed at 75 degrees in this embodiment, but not limited to this). After several laser heating steps, the resistor pairs on the semiconductor testkey pattern 1 are measured, for example, the difference between the resistance values of the two resistor patterns 30A and 30B included in the resistor pair 30 is measured, so as to find out the laser heating direction which has the least influence on the resistance value, and at the same time, find out the more suitable arrangement direction of the resistor pairs (such as horizontal or vertical). Preferably, after the laser heating step, the resistance difference between the two sides of the resistor pair should be within 0.5%, which is in line with the use specification.

In addition, although the included angle a between the laser and the substrate horizontal plane is fixed in this embodiment (for example, 75 degrees), in other embodiments of the present invention, the included angle between the laser and the substrate horizontal plane can be adjusted by setting it as a variable, and this concept also falls within the scope of the present invention.

In this embodiment, the purpose of arranging a plurality of resistor pairs 30 around the high density device region 20 is to design a semiconductor testkey pattern suitable for multiple laser test directions. In other words, according to the semiconductor testkey pattern shown in FIG. 1, laser experiments conducted from different directions can irradiate the resistor pair 30 and the high density device region 20 without changing the semiconductor testkey pattern according to different laser directions, thus saving test steps.

In addition, another purpose of arranging a plurality of resistor pairs 30 around the high density device region 20 in this embodiment is to observe the influence of hot spot diffusion on resistance values from all directions. The hot spot diffusion mentioned above means that when the laser irradiates the boundary of the high density device region 20, because this region belongs to the region where the device density changes greatly, the rate of laser heat energy transmission to the surrounding region and the cooling rate are also different. For example, towards the region with dense devices, the cooling rate of heat energy is slower, while towards the open region (the region with low device density), the cooling rate of heat energy is faster. The above phenomenon can also be called hot spot diffusion. In this embodiment, since the resistor pairs 30 are arranged around the high density device region 20, the laser can be irradiated to the boundary of the high density device region 20 regardless of the laser heating step from every angle, so that the influence of the resistance values of the resistor pairs 30 around the high density device region 20 under the hot spot diffusion can be observed.

After the laser heating step test is completed, the most suitable process parameters can be found, that is, the process parameters that have the least influence on the resistance difference of resistor pairs, and some resistor pairs can be fine-tuned (for example, fine-tuned patterns) to further reduce the resistance difference of resistor pairs. This can provide better parameters for the subsequent practical process steps.

In some embodiments of the present invention, a semiconductor testkey pattern 1 is provided, which comprises a high density device region 20 and a plurality of resistor pairs 30 surrounding the high density device region 20, wherein each resistor pair 30 comprises two mutually symmetrical resistor patterns 30A and 30B.

In some embodiments of the present invention, each of the resistor patterns 30A and 30B includes a plurality of strip-shaped resistor patterns 40 arranged in parallel with each other, and a plurality of wires 50 connect the strip-shaped resistor patterns 40 in series with each other.

In some embodiments of the present invention, the plurality of resistor pairs 30 include a plurality of resistor pairs 30 arranged along a first direction (e.g., resistor pairs arranged longitudinally on the left side in FIG. 2), while the rest of the testkey patterns include a plurality of resistor pairs 30 arranged along a second direction (e.g., resistor pairs arranged horizontally on the right side in FIG. 2).

In some embodiments of the present invention, the first direction and the second direction are perpendicular to each other (for example, horizontal direction and longitudinal direction, or X direction and Y direction).

In some embodiments of the present invention, a plurality of resistor pairs 30 arranged along the first direction include a plurality of strip resistor patterns 40 arranged along the first direction, and a plurality of resistor pairs 30 arranged along the second direction include a plurality of strip resistor patterns 40 arranged along the second direction.

In some embodiments of the present invention, the shortest distance between any one of the plurality of resistor pairs 30 and the high density device region 20 is between 1.5 μm and 50 μm.

In some embodiments of the present invention, a method for testing semiconductor testkey patterns is provided, which includes providing a semiconductor testkey pattern 1 including a high density device region 20 and a plurality of resistor pairs 30 surrounding the high density device region 20, wherein each resistor pair 30 includes two mutually symmetrical resistor patterns 30A and 30B, performing a laser heating step on the semiconductor testkey pattern, and testing resistance changes of each resistor pair of the semiconductor testkey pattern.

In some embodiments of the present invention, performing a laser heating step on the semiconductor testkey pattern 1 includes providing a plurality of substrates, each substrate including one semiconductor testkey pattern 1, performing a laser heating step on the semiconductor testkey pattern of one substrate from one angle, performing a laser heating step on the semiconductor testkey pattern of the other substrate from another angle, and finding out the most suitable angle.

In some embodiments of the present invention, the laser heating step includes laser heating the semiconductor testkey pattern from the most suitable angle in a scanning manner.

In some embodiments of the present invention, testing the resistance change of the semiconductor testkey pattern includes measuring the resistance difference value between two resistor patterns of each resistor pair after the laser heating step.

To sum up, the invention provides a semiconductor testkey pattern, which is characterized in that the applicant finds that the laser heating step will have a great influence on the resistance value of the resistance device, so in order to find out the problem in time at the front end of the process, the applicant provides a testkey pattern, which surrounds a plurality of resistor pairs around the high-density device region. Then, using this testkey pattern, the laser heating step can be performed from different angles, and the influence of hot spot diffusion test on the resistance value of the resistor pair can be performed. The semiconductor testkey pattern provided by the invention can be applied to the test of laser heating steps in different directions, and the most suitable process parameters can be found out through the test steps. Therefore, the problem of unpaired resistors can be found at the front end of the process, and the problems can be corrected in time to improve the yield and efficiency of the process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor testkey pattern, comprising:
   a high density device region; and
   a plurality of resistor pairs surrounding the high density device region, wherein each resistor pair comprises two mutually symmetrical resistor patterns, wherein each resistor pattern comprises a plurality of strip-shaped resistor patterns arranged in parallel with each other, and a plurality of wires connect the strip-shaped resistor patterns in series with each other, and wherein the plurality of resistor pairs comprise a plurality of resistor pairs arranged along a first direction, and the remaining part of the testkey pattern comprises a plurality of resistor pairs arranged along a second direction.

2. The semiconductor testkey pattern according to claim 1, wherein the first direction and the second direction are perpendicular to each other.

3. The semiconductor testkey pattern according to claim 1, wherein the plurality of resistor pairs arranged along the first direction comprise a plurality of strip-shaped resistor patterns arranged along the first direction, and the plurality of resistor pairs arranged along the second direction comprise a plurality of strip-shaped resistor patterns arranged along the second direction.

4. The semiconductor testkey pattern according to claim 1, wherein a shortest distance between any one of the plurality of resistor pairs and the high density device region is between 1.5 μm and 50 μm.

5. A method for testing semiconductor testkey patterns, comprising:
   providing a semiconductor testkey pattern, the semiconductor testkey pattern comprising:
     a high density device region;
     a plurality of resistor pairs surrounding the high density device region, wherein each resistor pair comprises two mutually symmetrical resistor patterns, wherein each resistor pattern comprises a plurality of strip-shaped resistor patterns arranged in parallel with each other, and a plurality of wires connect the strip-shaped resistor patterns in series with each other, and wherein the plurality of resistor pairs comprise a plurality of resistor pairs arranged along a first direction, and the remaining part of the testkey pattern comprises a plurality of resistor pairs arranged along a second direction; and
   performing a laser heating step on the semiconductor testkey pattern; and
   testing the resistance change of each resistor pair of the semiconductor testkey pattern.

6. The test method according to claim 5, wherein the first direction and the second direction are perpendicular to each other.

7. The test method according to claim 5, wherein the plurality of resistor pairs arranged along the first direction comprise a plurality of strip-shaped resistor patterns arranged along the first direction, and the plurality of resistor pairs arranged along the second direction comprise a plurality of strip-shaped resistor patterns arranged along the second direction.

8. The test method according to claim 5, wherein the laser heating step on the semiconductor testkey pattern comprises:
  providing a plurality of substrates, wherein each substrate comprises a semiconductor testkey pattern;
  performing a laser heating step on the semiconductor testkey pattern of one of the substrates from one angle;
  performing a laser heating step on the semiconductor testkey pattern of another substrate from another angle; and
  finding out a most suitable angle.

9. The test method according to claim 8, wherein the laser heating step comprises laser heating the semiconductor testkey pattern from the most suitable angle in a scanning manner.

10. The test method according to claim 5, wherein testing the resistance change of the semiconductor testkey pattern comprises:
  measuring the resistance difference value between the two resistor patterns of each resistor pair after the laser heating step is performed.

11. The test method according to claim 5, wherein a shortest distance between any one of the plurality of resistor pairs and the high density device region is between 1.5 μm and 50 μm.

* * * * *